(12) United States Patent
Yamamoto et al.

(10) Patent No.: US 9,670,575 B2
(45) Date of Patent: Jun. 6, 2017

(54) LAMINATED COATING FILM HAVING SUPERIOR WEAR RESISTANCE

(71) Applicant: KABUSHIKI KAISHA KOBE SEIKO SHO (Kobe Steel, Ltd.), Kobe-shi (JP)

(72) Inventors: Kenji Yamamoto, Kobe (JP); Maiko Abe, Kobe (JP); Mamoru Hosokawa, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/766,264

(22) PCT Filed: Mar. 14, 2014

(86) PCT No.: PCT/JP2014/056985
§ 371 (c)(1),
(2) Date: Aug. 6, 2015

(87) PCT Pub. No.: WO2014/156739
PCT Pub. Date: Oct. 2, 2014

(65) Prior Publication Data
US 2015/0368787 A1 Dec. 24, 2015

(30) Foreign Application Priority Data

Mar. 25, 2013 (JP) ................................. 2013-062260

(51) Int. Cl.
C23C 14/06 (2006.01)
C23C 28/04 (2006.01)
C23C 28/00 (2006.01)
C23C 14/24 (2006.01)
C23C 16/36 (2006.01)
C23C 16/38 (2006.01)

(52) U.S. Cl.
CPC .......... *C23C 14/0688* (2013.01); *C23C 14/06* (2013.01); *C23C 14/24* (2013.01); *C23C 16/36* (2013.01); *C23C 16/38* (2013.01); *C23C 28/042* (2013.01); *C23C 28/044* (2013.01); *C23C 28/42* (2013.01); *Y10T 428/24967* (2015.01); *Y10T 428/24975* (2015.01)

(58) Field of Classification Search
USPC ................ 428/216, 336, 698, 704, 697, 699
See application file for complete search history.

(56) References Cited

U.S. PATENT DOCUMENTS

| | | | | |
|---|---|---|---|---|
| 4,554,201 A | * | 11/1985 | Andreev | C23C 28/044 428/698 |
| 4,643,951 A | * | 2/1987 | Keem | C23C 28/00 428/698 |
| 4,835,062 A | * | 5/1989 | Holleck | C23C 28/044 428/698 |
| 4,895,770 A | * | 1/1990 | Schintlmeister | C23C 14/06 428/698 |
| 5,503,912 A | * | 4/1996 | Setoyama | C03C 17/3435 428/216 |
| 5,783,295 A | * | 7/1998 | Barnett | C23C 14/0021 428/216 |
| 6,077,596 A | * | 6/2000 | Hashimoto | C23C 14/0635 428/698 |
| 2005/0170162 A1 | | 8/2005 | Yamamoto et al. | |
| 2008/0038503 A1 | | 2/2008 | Yamamoto | |
| 2009/0068478 A1 | | 3/2009 | Yamamoto | |
| 2010/0304102 A1 | * | 12/2010 | Vetter | C23C 14/027 428/213 |

FOREIGN PATENT DOCUMENTS

| | | | |
|---|---|---|---|
| JP | 2005-226117 A | | 8/2005 |
| JP | 2005-256081 A | | 9/2005 |
| JP | 2007-126714 | * | 5/2007 |
| JP | 2008-63654 A | | 3/2008 |
| JP | 2009-68047 A | | 4/2009 |
| JP | 2011-93008 A | | 5/2011 |
| JP | 2011-93009 A | | 5/2011 |
| JP | 2011-183545 A | | 9/2011 |
| KR | 10-2006-0042924 A | | 5/2006 |

OTHER PUBLICATIONS

International Search Report issued Jun. 17, 2014 in PCT/JP2014/056985 filed Mar. 14, 2014.
Written Opinion of the International Searching Authority issued Jun. 17, 2014, in PCT/JP2014/056985 filed Mar. 14, 2014.

* cited by examiner

*Primary Examiner* — Archene Turner
(74) *Attorney, Agent, or Firm* — Oblon, McClelland, Maier & Neustadt, L.L.P.

(57) ABSTRACT

The present invention is a laminated coating film such that at least one of each of the below mentioned coating film (Q) and coating film (R) are laminated in alternation on a substrate. [Coating film Q] At least one coating film selected from the group consisting of: a coating film having a compositional formula of $Ti_{1-a-b-c}B_aC_bN_c$ and satisfying the atom ratios of each element being $0.2 \leq a \leq 0.7$, $0 \leq b \leq 0.35$, and $0 \leq c \leq 0.35$; a coating film having a compositional formula of $Si_{1-d-e}C_dN_e$ and satisfying the atom ratios of each element being $0.2 \leq d \leq 0.50$ and $0 \leq e \leq 0.3$; and a coating film having a compositional formula of $B_{1-f-g}C_fN_g$ and satisfying the atom ratios of each element being $0.03 \leq f \leq 0.25$ and $0 \leq g \leq 0.5$. [Coating film R] A coating film having a compositional formula of $L(B_xC_yN_{1-x-y})$ (where L is at least one element selected from the group consisting of W, Mo, and V) and satisfying the atom ratios of each element being $0 \leq x \leq 0.15$ and $0 \leq y \leq 0.5$.

14 Claims, No Drawings

LAMINATED COATING FILM HAVING SUPERIOR WEAR RESISTANCE

TECHNICAL FIELD

The present invention relates to a laminated coating having superior wear resistance. For example, the present invention relates to a laminated coating having superior wear resistance and formed on a surface of a tool such as a cutting tool and a die.

BACKGROUND ART

For the purpose of increasing the life of tools such as cutting tools and dies, the wear resistance of the tools has been conventionally improved in such a manner that surfaces of the tools are coated with a hard coating of, e.g., TiN, TiCN, or TiAlN.

In recent years, e.g., films with laminated structures described in Patent Documents 1 and 2 have been proposed as coatings formed on cutting tool surfaces. Specifically, Patent Documents 1 and 2 each disclose a laminated coating configured such that two or more coatings A made of a solid solution of Mo and N, $Mo_2N$, MoN, or a mixture thereof and two or more coatings B made of $Ti_{1-x-y}Al_xSi_yN$ are alternately laminated on each other. In such a laminated coating, the layer thickness of each of the coatings A, B, the thickness ratio between the coatings A, B, and the gradient structure of layer thickness ratio in the cross section of the coating along a lamination direction are defined. Moreover, in this laminated coating, the coatings A exhibit lubricity and welding resistance, thereby effectively improving the quality of processing of a cutting target material and effectively reducing the temperature of a blade edge in high-speed dry processing. The coatings B exhibit excellent balance between wear resistance and toughness. However, since more superior wear resistance is required for, e.g., cutting tools, more study should be made.

CITATION LIST

Patent Document

Patent Document 1: JP 2011-093008A
Patent Document 2: JP 2011-093009A

SUMMARY OF THE INVENTION

Problem to be Solved by the Invention

The present invention has been made in view of the above-described situation, and is intended to realize a laminated coating which has superior wear resistance and which is formed on a surface of a tool such as a cutting tool and a die so that the wear resistance of the cutting tool can be sufficiently improved.

Means for Solving Problem

The laminated coating of the present invention capable of solving the above-described problem is a laminated coating formed on a substrate, which includes at least one coating Q and at least one coating R, the coatings Q, R being alternately laminated on each other to produce superior wear resistance of the laminated coating.

The coating Q is at least one coating selected from a group consisting of a coating having a compositional formula of $Ti_{1-a-b-c}B_aC_bN_c$ and satisfying $0.2 \leq a = 0.7$, $0 \leq b \leq 0.35$, and $0 \leq c \leq 0.35$, where a, b, and c denote atom ratios of B, C, and N, respectively, a coating having a compositional formula of $Si_{1-d-e}C_dN_e$ and satisfying $0.2 \leq d \leq 0.50$ and $0 \leq e \leq 0.3$, where d and e denote atom ratios of C and N, respectively, and a coating having a compositional formula of $B_{1-f-g}C_fN_g$ and satisfying $0.03 \leq f \leq 0.25$ and $0 \leq g \leq 0.5$, where f and g denote atom ratios of C and N, respectively.

The coating R is a coating having a compositional formula of $L(B_xC_yN_{1-x-y})$ and satisfying $0 \leq x \leq 0.15$ and $0 \leq y \leq 0.5$, where L is at least one element selected from a group consisting of W, Mo, and V, and x and y denote atom ratios of B and C, respectively.

In a preferable embodiment of the present invention, the film thickness of each of the coatings Q, R is equal to or greater than 2 nm.

In the preferable embodiment of the present invention, the film thickness of each of the coatings Q, R is equal to or less than 100 nm.

Effect of the Invention

According to the present invention, a laminated coating having superior wear resistance can be realized. Moreover, with this laminated coating formed on a surface (indicating the "outermost surface," and the same applies to the following) of a tool (in particular, a tool used for punching under wet environment) such as a cutting tool and a die, the wear resistance of, e.g., the cutting tool can be improved. As a result, the life of the cutting tool can be increased.

DESCRIPTION OF EMBODIMENTS

In order to solve the above-described problem, the inventors of the present invention have intensively conducted study on hard coatings formed on surfaces of tools such as cutting tools and dies. Specifically, the present invention has been achieved based on the following idea. That is, $TiB_2$, SiC, $B_4C$, or a compound, such as TiBN, TiBC, SiCN, and BCN, formed by addition of C or N to $TiB_2$, SiC, or $B_4C$ is a hard compound, but has a high coefficient of friction against a metal material. Thus, in the case where only a coating made of the above-described hard compound is formed on the outermost surface of the above-described cutting tool or the like, friction heat is generated due to sliding in cutting, and a substrate is softened due to a temperature increase. This leads to a problem that damage of the coating is worsened due to softening of the substrate. For this reason, based on the idea that a coating made of the above-described hard compound and a compound layer exhibiting lubricity are laminated on each other to form a coating having superior wear resistance, a laminated coating in which at least one coating Q and at least one coating R described later are alternately laminated on each other has been found. As a result, the present invention has been achieved.

[Coating Q]

At least one coating selected from the group consisting of a coating having a compositional formula of $Ti_{1-a-b-c}B_aC_bN_c$ (where "a," "b," and "c" denote the atom ratios of "B," "C," and "N," respectively) and satisfying $0.2 \leq a \leq 0.7$, $0 \leq b \leq 0.35$, and $0 \leq c \leq 0.35$;

a coating having a compositional formula of $Si_{1-d-e}C_dN_e$ (where "d" and "e" denote the atom ratios of "C" and "N," respectively) and satisfying $0.2 \leq d \leq 0.50$ and $0 \leq e \leq 0.3$; and a coating having a compositional formula of $B_{1-f-g}C_fN_g$ (where "f" and "g" denote the atom ratios of "C" and "N," respectively) and satisfying $0.03 \leq f \leq 0.25$ and $0 \leq g \leq 0.5$

[Coating R]

A coating having a compositional formula of $L(B_xC_yN_{1-x-y})$ (where "L" is at least one element selected from the group consisting of W, Mo, and V, and "x" and "y" denote the atom ratios of "B" and "C," respectively) and satisfying $0 \leq x \leq 0.15$ and $0 \leq y \leq 0.5$.

The reasons for specifying each coating will be described below.

[Coating Q]

Examples of the coating Q include a coating (a coating Q1) having a compositional formula of $Ti_{1-a-b-c}B_aC_bN_c$. The coating Q1 may be a coating which further contains C and N in addition to $TiB_2$ ($Ti_{0.33}B_{0.67}$), which has a Ti—N bond, a Ti—C bond, or a B—C bond exhibiting high hardness or a B—N bond exhibiting lubricity, and which has more superior wear resistance. In the case of containing C and N, a C content (b) is preferably equal to or greater than 0.05, more preferably equal to or greater than 0.10, and much more preferably equal to or greater than 0.15. Moreover, an N content (c) is preferably equal to or greater than 0.05, and more preferably equal to or greater than 0.10. However, an excessive C content and an excessive N content lead to lowering of the hardness, i.e., lowering of the wear resistance. For this reason, the upper limits of the C content and the N content are 0.35. The upper limit of the C content is preferably equal to or less than 0.20. The upper limit of the N content is preferably equal to or less than 0.15.

Considering ensuring of high hardness, a B content (a) in the coating Q1 is equal to or greater than 0.2, and preferably equal to or greater than 0.30. Note that the upper limit of the B content is 0.7, considering the case of $TiB_2$ (in the case of not containing C and N). In the case of containing C and/or N, the B content can be equal to or less than 0.60, and preferably equal to or less than 0.50.

A Ti content (1−a−b−c) in the coating Q1 is determined depending on the contents of other elements. The lower limit of the Ti content can be, e.g., equal to or greater than 0.30, and preferably equal to or greater than 0.40. Moreover, the upper limit of the Ti content can be, e.g., equal to or less than 0.50, and preferably equal to or less than 0.45.

The coating Q may be a coating (a coating Q2) having a compositional formula of $Si_{1-d-e}C_dN_e$. The coating Q2 may be a coating which further contains N in addition to SiC ($Si_{0.50}C_{0.50}$). N can be contained to increase lubricity. In order to obtain such an effect produced by N, an N content (e) is preferably equal to or greater than 0.05. However, an excessive N content leads to lowering of hardness. For this reason, the upper limit of the N content is 0.3. The N content is preferably equal to or less than 0.1.

Considering ensuring of high hardness, a C content (d) in the coating Q2 is equal to or greater than 0.2, and preferably equal to or greater than 0.30. Note that the upper limit of the C content is 0.50, considering SiC. In the case of containing N, the C content can be equal to or less than 0.40.

A Si content (1−d−e) in the coating Q2 is determined depending on the contents of other elements (C, N). The Si content can fall within a range of about 0.3-0.6.

The coating Q may be a coating (a coating Q3) having a compositional formula of $B_{1-f-g}C_fN_g$. The coating Q3 may be a coating which further contains N in addition to $B_4C$ ($B_{0.80}C_{0.20}$). N can be contained to generate a B—N bond exhibiting lubricity. In order to obtain such an effect produced by N, an N content (g) is preferably equal to or greater than 0.10, and more preferably equal to or greater than 0.15. However, an excessive N content leads to lowering of hardness. For this reason, the upper limit of the N content is 0.5. The N content is preferably equal to or less than 0.4.

Considering ensuring of high hardness, a C content (f) in the coating Q3 is equal to or greater than 0.03, preferably equal to or greater than 0.04, more preferably equal to or greater than 0.08, and much more preferably equal to or greater than 0.10. Note that the upper limit of the C content is 0.25, considering $B_4C$. In the case of containing N, the C content can be equal to or less than 0.20, and preferably equal to or less than 0.16.

A B content (1−f−g) in the coating Q3 is determined depending on the contents of other elements (C, N). The B content can fall within a range of about 0.50-0.80.

The coating Q may be at least one coating selected from the group consisting of the coatings Q1, Q2, Q3. Each of the coatings Q1, Q2, Q3 forming the coating Q may be configured such that two or more coatings having different compositions within the above-described composition ranges are laminated on each other.

[Coating R]

The coating R contains L (hereinafter referred to as an "element L") forming lubricating oxide in sliding, and specifically, contains at least one element selected from the group consisting of W, Mo, and V. Since V forms lubricating oxide at the lowest temperature, V is preferable as the element L.

The coating R may be, in addition to nitride of the element L, further made of a compound containing B and/or C. B and/or C can be contained to further increase hardness. In order to obtain such an effect, a B content (x) is preferably equal to or greater than 0.05 in the case of containing B. However, an excessive B content leads to lowering of hardness. For this reason, the B content is equal to or less than 0.15, and preferably equal to or less than 0.10. In the case of containing C, a C content (y) is preferably equal to or greater than 0.15, and more preferably equal to or greater than 0.20. However, an excessive C content leads to lowering of hardness. For this reason, the C content is equal to or less than 0.5, and preferably equal to or less than 0.25.

The coating R may be a coating configured such that two or more coatings having different compositions within the above-described composition ranges are laminated on each other.

[Thickness of Coating]

In order to produce each function of the coatings Q, R, it is necessary that each coating has a thickness of equal to or greater than a certain value and is in an independently-laminated state. The "independently-laminated state" indicates the state in which each coating has a thickness of equal to or greater than a certain value. In formation of a multi-layer film, tendency shows that a small film thickness of each layer results in mixing of the compositions of the coatings. Thus, as long as each layer is not formed thick to some extent, the composition of each layer is not constant across such a layer. For this reason, the film thickness (in the present invention, the "film thickness" indicates the film thickness (thickness) of a single layer, and is distinguished from the total film thickness (total thickness) of the laminated coating) of each of the coatings Q, R is preferably equal to or greater than 2 nm, more preferably equal to or greater than 5 nm, and much more preferably equal to or greater than 10 nm. Suppose that the total film thickness of the laminated coating is 3 μm. In this case, the laminated coating can be formed so as to have a double-layer structure of the coating Q having a film thickness of 1500 nm and the coating R having a film thickness of 1500 nm. However, in order to produce, to the maximum extent, a hardness enhancement effect of the coating Q and a lubricating effect of the coating R, the laminated coating preferably has such a structure that two or more coatings Q and two or more coatings R are alternately laminated on each other. From this point of view, the film thickness of each of the coatings Q, R is preferably equal to or less than 100 nm. The upper limit of such a film thickness is more preferably equal to or less than 50 nm, and much more preferably equal to or less than 30 nm.

The film thicknesses of the coatings Q, R are not necessarily the same as each other, and may be changed according to the intended use. For example, the film thickness of the coating Q may be fixed (e.g., 20 nm), and the film thickness of the coating R may vary between 2-100 nm.

Due to an extremely-small total film thickness (the total thickness of the coatings Q, R) of the laminated coating, it is difficult to sufficiently produce superior wear resistance. For this reason, the total film thickness is preferably equal to or greater than 1 μm, and more preferably equal to or greater than 2 μm. On the other hand, due to an extremely-large total film thickness of the laminated coating, breakage or separation of the films easily occurs in cutting. For this reason, such a total film thickness is preferably equal to or less than 5 urn, and more preferably equal to or less than 4 μm.

[Method for Forming Laminated Coating]

The present invention does not specify the method for forming the above-described laminated coating, and such laminated coatings can be produced using well-known methods such as a physical vapor deposition (PVD) and a chemical vapor deposition (CVD). Considering, e.g., ensuring of adhesiveness to the substrate, the laminated coating is preferably produced using the PVD. Specifically, examples include a sputtering method, a vacuum deposition method, and an ion plating method.

Examples of the method for forming the coating Q include the method for forming the coating Q by using, as an evaporation source (a target), a target containing components (Ti, Si, and B) other than C and N forming the coating Q and using, as atmosphere gas (reactive gas), nitrogen gas or hydrocarbon gas (e.g., methane and acetylene). Alternatively, the coating Q may be formed using a target (nitride, carbonitride, carbide, borcarbide, bornitride, or borcarbonitride) made of the compound containing the elements forming the coating Q.

Examples of the method for forming the coating R include the method for forming the coating R by using, as an evaporation source (a target), a target formed of the element L (in the case of forming a coating containing B, the target further contains B) and using, as atmosphere gas (reactive gas), nitrogen gas or hydrocarbon gas (e.g., methane and acetylene). Alternatively, the coating R may be formed using a target (nitride, carbonitride, carbide, borcarbide, bornitride, or borcarbonitride) made of the compound containing the elements forming the coating R. In the case of using the above-described reactive gas (nitrogen gas or hydrocarbon gas), noble gas of, e.g., Ar, Ne, or Xe may be, in addition to the reactive gas, added for discharge stability.

For example, a film deposition system illustrated in FIG. 1 of JP 2008-024976A and including two arc evaporation sources and two sputtering evaporation sources can be used as the system for producing the laminated coating. Examples of the film deposition method using the film deposition system include the following method. The target for formation of the coating Q is attached to one of the two sputtering evaporation sources, and the target for formation of the coating R is attached to the other sputtering evaporation source. Then, the targets alternately discharge, thereby forming the laminated coating of the coatings Q, R by the sputtering method. Note that one of the coatings Q, R can be formed by the ion plating method, and the other one of the coatings Q, R can be formed by the sputtering method.

Preferable film deposition conditions in the case of forming the coating Q and/or the coating R by the sputtering method will be described below.

First, the temperature of the substrate (a processing target) in film deposition may be optionally selected according to the type of the substrate. Considering ensuring of adhesiveness between the substrate and the laminated coating, the temperature is preferably equal to or higher than 300° C., and more preferably equal to or higher than 400° C. On the other hand, considering, e.g., prevention of deformation of the substrate, the temperature of the substrate is preferably equal to or lower than 700° C., and more preferably equal to or lower than 600° C.

A bias voltage applied to the substrate (the processing target) in film deposition is preferably within a range of 30-200 V (a negative bias voltage providing the negative potential of the substrate with respect to the ground potential, and the same applies to the following). It is considered that the bias voltage is applied to the substrate to effectively ion-bombard the substrate (the processing target), and therefore, formation of a film having a rock salt structure is promoted. In order to produce such an effect, the above-described bias voltage is preferably equal to or higher than 30 V. However, if the bias voltage is too high, the film is etched with ionized gas for film deposition, resulting in an extremely-low film deposition rate. For this reason, the bias voltage is preferably equal to or lower than 200 V.

Further, in the present invention, the partial pressure or total pressure of reactive gas in film deposition preferably falls within a range of 0.1-0.6 Pa. This is because if the partial or total pressure is less than 0.1 Pa, the amount of nitrogen in the formed coating is insufficient and the coating is not formed with a stoichiometric composition.

The laminated coating of the present invention is preferably formed on a surface of a tool, thereby sufficiently producing the advantageous effects thereof. Examples of the tool include cutting tools such as tips, drills, and end mills, various types of dies for forge processing, press molding, extrusion molding, shearing, etc., and tools such as punches. In particular, the laminated coating of the present invention is suitable for tools used for cutting under wet environment. More particularly, the laminated coating of the present invention is suitable for drills mainly used for wet processing.

The substrate forming the laminated coating of the present invention is optionally determined according to the above-described types of tools. Examples of the substrate include substrates made of metal materials such as various types of steel and cemented carbides, the steels including, e.g., carbon steels for mechanical structures, alloy steels for structures, tool steels, and stainless steels. Moreover, the examples of the substrate further include a substrate configured such that, e.g., a plated layer or a sprayed layer as an intermediate layer is formed on a surface of the metal material.

An underlayer of, e.g., TiAlN, TiN, or CrN may be formed between the substrate and the laminated coating of the present invention.

EXAMPLES

The present invention will be more specifically described below with reference to examples, but is not limited to the later-described examples. Needless to say, appropriate changes can be additionally made within a scope adaptable to the purposes described above and below, and are encompassed in the technical scope of the present invention.

First Example

In a first example, a laminated coating (the thicknesses of coatings Q, R are the same as each other) was formed, which includes the coatings Q, R whose compositions are different from each other. Study was conducted on the influence of each composition on wear resistance.

A laminated coating was, using a film deposition system including a plurality of evaporation sources, formed such that coatings Q, R with compositions shown in Table 1 are alternately laminated on each other. The details are as follows. A cutting tool (a double-blade carbide drill having φ8.5 mm and used for a cutting test) was prepared as a substrate. This substrate was subjected to ultrasonic degreasing and cleaning in ethanol, and then, was introduced into the film deposition system. After air was discharged to $5 \times 10^{-3}$ Pa, the substrate was heated to 500° C. Subsequently, etching was performed with Ar ions for five minutes. Then, a laminated coating (the total film thickness of coatings Q, R is about 3 μm (about 3000 nm)) was formed on the substrate as specifically described below.

A target formed of components (Ti, Si, B) other than C and N forming the coating Q shown in table 1 was used as a target for formation of the coating Q. In the case of containing N in the coating Q, nitrogen gas was used as atmosphere gas in formation of the coating Q, and in the case of containing C in the coating Q, hydrocarbon gas was used as the atmosphere gas in formation of the coating Q (if necessary, Ar gas was further used). In the case of not containing N and C in the coating Q, only Ar gas was used.

A target (further containing B in the case of containing B in the coating R) formed of an element L forming the coating R shown in Table 1 was used as a target for formation of the coating R. In the case of containing N in the coating Q, nitrogen gas was used as atmosphere gas in formation of the coating R, and in the case of containing C in the coating Q, hydrocarbon gas was used as the atmosphere gas in formation of the coating R (if necessary, Ar gas was further used).

The targets for formation of the coatings Q, R were attached respectively to the different evaporation sources, and then, a table on which the substrate is placed was rotated in the system to cause the targets to alternately discharge. In this manner, a laminated coating (the thickness of a single layer of each coating is shown in Table 1) was formed by the sputtering method. Note that in any of the examples, the sputtering described above was performed under the following conditions: a substrate temperature is 500° C.; the total pressure of atmosphere gas is 0.6 Pa; a power of 3 kW is applied to the sputtering evaporation source (a target diameter: 6 inches=152 mm); a negative bias voltage is 100 V. The thickness of each coating and the number of lamination of each coating were adjusted in such a manner that the rotation speed of the table on which the substrate is placed (i.e., the rotation speed of the substrate) and the discharge time of the target are changed.

Samples in each of which a TiAlN single-layer film (No. 1 in Table 1) or a TiN single-layer film (No. 2 in Table 1) is formed on the substrate and samples (Nos. 31-37 in Table 1) in each of which only the coating Q is formed on the substrate were also prepared as comparative examples.

[Cutting Test]

Under the later-described conditions, the cutting test was performed using the samples in each of which the film is formed on a surface of the cutting tool. In this cutting test, the number of holes formed until the carbide drill is broken was taken as the index for tool performance. The cases where the "number of holes formed until the carbide drill is broken" (the number of cuttable holes) is equal to or higher than 1500 were evaluated as exhibiting superior wear resistance.

[Cutting Test Conditions]

Cutting target material: S50C (green lumber)

Cutting speed: 100 m/min

Feeding: 0.24 mm per rotation

Hole depth: 23 mm

Lubrication: oil supply from outside, emulsion

Evaluation index: the number of holes formed until the carbide drill is broken

TABLE 1

| No. | Composition of Coating Q (in units of an atom ratio) | Film Thickness of Coating Q (nm) | Composition of Coating R (in units of an atom ratio) | Film Thickness of Coating R (nm) | The Number of Cuttable Holes (the counts of holes) |
|---|---|---|---|---|---|
| 1 | (Ti0.50Al0.50)N | 3000 | N/A | N/A | 500 |
| 2 | TiN | 3000 | N/A | N/A | 200 |
| 3 | Ti0.33B0.67 | 20 | VN | 20 | 2300 |
| 4 | Ti0.33B0.47C0.20 | 20 | VN | 20 | 2500 |
| 5 | Ti0.45B0.20C0.35 | 20 | VN | 20 | 2200 |
| 6 | Ti0.30B0.20C0.50 | 20 | VN | 20 | 1000 |
| 7 | Ti0.33B0.47N0.20 | 20 | VN | 20 | 2300 |
| 8 | Ti0.45B0.20N0.35 | 20 | VN | 20 | 2300 |
| 9 | Ti0.30B0.20N0.50 | 20 | VN | 20 | 900 |
| 10 | Ti0.33B0.47N0.10C0.10 | 20 | VN | 20 | 2400 |
| 11 | Ti0.45B0.20N0.15C0.20 | 20 | VN | 20 | 1900 |
| 12 | Ti0.30B0.20N0.25C0.25 | 20 | VN | 20 | 1600 |
| 13 | Si0.50C0.50 | 20 | VN | 20 | 2500 |
| 14 | Si0.50C0.30N0.20 | 20 | VN | 20 | 2500 |
| 15 | Si0.50C0.20N0.30 | 20 | VN | 20 | 2500 |
| 16 | Si0.50C0.10N0.40 | 20 | VN | 20 | 800 |
| 17 | B0.80C0.20 | 20 | VN | 20 | 2000 |
| 18 | B0.74C0.16N0.10 | 20 | VN | 20 | 2200 |
| 19 | B0.62C0.08N0.30 | 20 | VN | 20 | 2100 |
| 20 | B0.56C0.04N0.40 | 20 | VN | 20 | 2100 |

TABLE 1-continued

| No. | Composition of Coating Q (in units of an atom ratio) | Film Thickness of Coating Q (nm) | Composition of Coating R (in units of an atom ratio) | Film Thickness of Coating R (nm) | The Number of Cuttable Holes (the counts of holes) |
|---|---|---|---|---|---|
| 21 | B0.53C0.02N0.45 | 20 | VN | 20 | 1100 |
| 22 | Si0.50C0.50 | 20 | VN | 20 | 2500 |
| 23 | Si0.50C0.50 | 20 | WN | 20 | 2400 |
| 24 | Si0.50C0.50 | 20 | MoN | 20 | 2300 |
| 25 | Si0.50C0.50 | 20 | (V0.50Mo0.50)N | 20 | 2200 |
| 26 | Si0.50C0.50 | 20 | (W0.50Mo0.50)N | 20 | 2100 |
| 27 | Si0.50C0.50 | 20 | V(N0.40C0.60) | 20 | 800 |
| 28 | Si0.50C0.50 | 20 | V(B0.15N0.85) | 20 | 2400 |
| 29 | Si0.50C0.50 | 20 | V(B0.40N0.60) | 20 | 1200 |
| 30 | Si0.50C0.50 | 20 | V(B0.15N0.65C0.20) | 20 | 2200 |
| 31 | Si0.50C0.50 | 3000 | N/A | N/A | 1000 |
| 32 | Ti0.33B0.67 | 3000 | N/A | N/A | 900 |
| 33 | B0.80C0.20 | 3000 | N/A | N/A | 800 |
| 34 | Ti0.33B0.47N0.20 | 3000 | N/A | N/A | 700 |
| 35 | Ti0.33B0.47C0.20 | 3000 | N/A | N/A | 800 |
| 36 | Si0.50C0.30N0.20 | 3000 | N/A | N/A | 600 |
| 37 | B0.62C0.08N0.30 | 3000 | N/A | N/A | 700 |

As shown in Table 1, in Nos. 3-5, 7, 8, 10-15, 17-20, 22-26, 28, and 30, the laminated coating satisfying the conditions of the present invention was formed, and therefore, favorable wear resistance was exhibited. On the other hand, the examples other than the above fall outside the range defined in the present invention, and therefore, superior wear resistance was not exhibited. The details are as follows.

Each of Nos. 1 and 2 is a conventional example (the comparative example) where the $Ti_{0.50}Al_{0.50}N$ single-layer film or the TiN single-layer film was formed. In any of these examples, the number of cuttable holes was small, and inferior wear resistance was exhibited.

In No. 6, the C content of the coating Q was excessive. In No. 9, the N content of the coating Q was excessive. As a result, in any of these examples, inferior wear resistance was exhibited.

In No. 16, the N content of the coating Q was excessive, and the C content of the coating Q was insufficient. As a result, inferior wear resistance was exhibited.

In No. 21, the C content of the coating Q was insufficient. In No. 27, the C content of the coating R was excessive. In No. 29, the B content of the coating R was excessive. As a result, in any of these examples, inferior wear resistance was exhibited.

In Nos. 31-37, only the coating Q, i.e., the single-layer coating made of a hard compound, was formed, and therefore, superior wear resistance was not exhibited.

Second Example

In a second example, sample coatings (all having the same total thickness of 3000 nm) were formed, which have the same composition of coatings Q, R and which are different from each other in the film thickness of the coatings Q, R and the number of lamination of the coatings Q, R. Study was conducted on the influence of the film thicknesses of the coatings Q, R and the number of lamination of the coatings Q, R on cutting performance.

The composition of the coating Q was fixed to $Si_{0.50}C_{0.50}$, and the composition of the coating R was fixed to VN. As shown in Table 2, the samples were formed as in the first example, except that the film thickness of each of the coatings Q, R and the total thickness of the coatings Q, R vary according to the samples. Then, a cutting test was performed as in the first example. The results are shown in Table 2.

TABLE 2

| No. | Composition of Coating Q (in units of an atom ratio) | Film Thickness of Coating Q (nm) | Composition of Coating R | Film Thickness of Coating R (nm) | Total Thickness (nm) | The Number of Cuttable Holes (the counts of holes) |
|---|---|---|---|---|---|---|
| 1 | Si0.50C0.50 | 20 | VN | 20 | 3000 | 2500 |
| 2 | Si0.50C0.50 | 1 | VN | 1 | 3000 | 1500 |
| 3 | Si0.50C0.50 | 2 | VN | 2 | 3000 | 1800 |
| 4 | Si0.50C0.50 | 10 | VN | 10 | 3000 | 2200 |
| 5 | Si0.50C0.50 | 50 | VN | 50 | 3000 | 2700 |
| 6 | Si0.50C0.50 | 100 | VN | 100 | 3000 | 2600 |
| 7 | Si0.50C0.50 | 200 | VN | 200 | 3200 | 2000 |
| 8 | Si0.50C0.50 | 1000 | VN | 1000 | 2000 | 1900 |
| 9 | Si0.50C0.50 | 1500 | VN | 1500 | 3000 | 1900 |
| 10 | Si0.50C0.50 | 10 | VN | 50 | 3000 | 2500 |
| 11 | Si0.50C0.50 | 5 | VN | 20 | 3000 | 2700 |
| 12 | Si0.50C0.50 | 10 | VN | 50 | 3000 | 2900 |
| 13 | Si0.50C0.50 | 1000 | VN | 2000 | 3000 | 1800 |

As shown in Table 2, in Nos. 1-13, the specified coatings Q, R were laminated on each other. Thus, in any of these cases, favorable wear resistance was exhibited. Particularly in Nos. 1, 3-6, and 10-12, the film thickness of each of the coatings Q, R falls within a more preferable range, and therefore, more superior wear resistance was exhibited.

The present invention has been described in detail with reference to the particular embodiment. However, it is obvious to those skilled in the art that various changes and modifications can be made without departing from the spirit and scope of the present invention.

The present application is based on the Japanese patent application (JP 2013-062260) filed on Mar. 25, 2013, the disclosure of which is incorporated herein by reference.

INDUSTRIAL APPLICABILITY

The laminated coating of the present invention is formed on tools such as cutting tools and dies, thereby increasing the life of these tools.

The invention claimed is:

1. A laminated coating formed on a substrate, comprising:
  a coating Q and a coating R, the coating Q and the coating R being alternately laminated on each other to impart wear resistance to the laminated coating,
  wherein the coating Q is at least one selected from the group consisting of:
    a coating having a compositional formula of $Ti_{1-a-b-c}B_aC_bN_c$, where:
      $0.2 \leq a \leq 0.7$, $0 \leq b \leq 0.35$, and $0 \leq c \leq 0.35$, and
      a, b, and c denote B atom ratio, C atom ratio, and N atom ratio, respectively,
    a coating having a compositional formula of $Si_{1-d-e}C_dN_e$, where:
      $0.2 \leq d \leq 0.50$ and $0 \leq e \leq 0.3$, and
      d and e denote C atom ratio and N atom ratio, respectively, and
    a coating having a compositional formula of $B_{1-f-g}C_fN_g$, where:
      $0.03 \leq f \leq 0.25$ and $0 \leq g \leq 0.5$, and
      f and g denote C atom ratio and N atom ratio, respectively, and
  wherein the coating R is a coating having a compositional formula of $L(B_xC_yN_{1-x-y})$, where:
    L is at least one selected from the group consisting of W, Mo, and V,
    $0 \leq x \leq 0.15$ and $0 \leq y \leq 0.5$, and
    x and y denote B atom ratio and C atom ratio, respectively.

2. The laminated coating according to claim 1, wherein the coating Q and the coating R each has a film thickness of equal to or greater than 2 nm.

3. The laminated coating according to claim 1, wherein the coating Q and the coating R each has a film thickness of equal to or less than 100 nm.

4. The laminated coating according to claim 1, comprising a plurality of alternating coatings Q and coatings R.

5. The laminated coating according to claim 4, having a total film thickness of from 1,000 to 5,000 nm.

6. The laminated coating according to claim 5, wherein the coatings Q has a thickness of 2-50 nm and the coatings R have a thickness of 2-50 nm.

7. The laminated coating according to claim 1, wherein the coating Q has a compositional formula of $Ti_{1-a-b-c}B_aC_bN_c$, where:
  $0.2 \leq a \leq 0.67$,
  $0.1 \leq b \leq 0.35$,
  $0.1 \leq c \leq 0.25$.

8. The laminated coating according to claim 1, wherein the coating Q has a compositional formula of $Si_{1-d-e}C_dN_e$, where:
  $0.3 \leq d \leq 0.5$,
  $0.2 \leq e \leq 0.3$.

9. The laminated coating according to claim 1, wherein the coating Q has a compositional formula of $B_{1-f-g}C_fN_g$, where:
  $0.04 \leq f \leq 0.16$,
  $0.1 \leq g \leq 0.45$.

10. The laminated coating according to claim 1, wherein the coating R has a composition formula of LN.

11. The laminated coating according to claim 10, wherein L is V.

12. The laminated coating according to claim 10, wherein L is V and Mo, or W and Mo.

13. The laminated coating according to claim 1, wherein the coating R is $0.35 \leq (1-x-y) \leq 1$.

14. The laminated coating according to claim 1, wherein all of the coatings Q have the same compositional formula and all of the coatings R have the same compositional formula.

* * * * *